United States Patent
Casey et al.

(10) Patent No.: US 7,038,257 B2
(45) Date of Patent: May 2, 2006

(54) SYSTEM AND METHOD FOR PROVIDING SCALABILITY IN AN INTEGRATED CIRCUIT

(75) Inventors: Michael Casey, London (GB); Hong Hao, Saratoga, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/936,016

(22) Filed: Sep. 7, 2004

(65) Prior Publication Data

US 2006/0049496 A1    Mar. 9, 2006

(51) Int. Cl.
*H01L 27/10* (2006.01)
*H01L 23/02* (2006.01)
*H01L 23/48* (2006.01)
*H01L 23/52* (2006.01)
*H01L 29/40* (2006.01)

(52) U.S. Cl. .................. 257/203; 257/202; 257/678; 257/737

(58) Field of Classification Search ........ 257/202–203, 257/678, 737–738
See application file for complete search history.

(56) References Cited

U.S. PATENT DOCUMENTS 5,543,640 A * 8/1996 Sutherland et al. .......... 257/202

* cited by examiner

*Primary Examiner*—Cuong Nguyen
(74) *Attorney, Agent, or Firm*—Sawyer Law Group

(57) ABSTRACT

The invention provides a system and method for providing scalability in an integrated circuit (IC) having a package coupled to a die through package balls. The die includes a plurality of input/output (I/O) slots and a hardmac configured to implement a logic function. A patch board is included between the hardmac and the I/O slots, wherein the hardmac includes a plurality of attachment points. The hardmac is attached to the plurality of I/O slots through the patch board, wherein adjacent attachment points join to non-adjacent I/O slots through the patch board.

13 Claims, 4 Drawing Sheets

SYSTEM AND METHOD FOR PROVIDING SCALABILITY IN AN INTEGRATED CIRCUIT

FIELD OF THE INVENTION

The present invention relates to integrated circuit design, and more particularly to a system and method for providing scalability in an integrated circuit.

BACKGROUND OF THE INVENTION

Integrated circuits (ICs) comprise many transistors and the electrical interconnections between them. Depending upon the interconnection topology, transistors perform Boolean logic functions like AND, OR, NOT, NOR.

ICs and chips have become increasingly complex, with the speed and capacity of chips doubling about every eighteen months. This increase has resulted from advances in design software, fabrication technology, semiconductor materials, and chip design. An increased density of transistors per square centimeter and faster clock speeds, however, make it increasingly difficult to specify and design a chip that performs as actually specified. Unanticipated and sometimes subtle interactions between the transistors and other electronic structures may adversely affect the performance of the circuit. These difficulties increase the expense and risk of designing and fabricating chips, especially those that are custom designed for a specific application.

The challenge of complexity has been met by introducing specialized software tools intended to design chips correctly and efficiently. The software tools have become complex, resulting in "higher levels of abstraction," which simply means that the logical entities with which designers work are standardized, encapsulated, and bundled together so they can be treated like black box functions.

FIG. 1 is a block diagram illustrating a conventional IC 10 made up of package 12 and die 14. Die 14 is typically a thin silicon-based wafer that is attached to package 12 through various techniques, for example wirebonding and flip-chip, each technique used with different types of packages. Different dies are typically different devices with different functionality, for example an analog-to-digital converter or a memory device.

Die 14 includes rcell fabric 16 that is a medium that contains circuit elements (not shown) and the I/O interface. In IC design, circuit elements bundled together and treated like black box functions may be called hard macros, or "hardmacs." Hardmac is a generally rectangular cell that may be a complex hierarchical module containing several smaller modules. Hardmac 18 is part of the I/O interface and is intended to control signal transmission between the circuit elements of die 14 and package 12, or, more broadly, to the printed circuit board (PCB) (not shown) to which package 12 is attached. Hardmacs 18 are difficult to design and therefore expensive.

Hardmacs 18 typically align with and connect to bit slices 20 in a 1-to-1 ratio. For example, four adjacent bit slices 20 align with one hardmac 18 that has four attachment points 22.

Bit slices 20 align with and connect to I/O slots 22 in a 1-to-1 ratio, which typically map internal and external signaling levels between IC 10 and the PCB.

Each die 14 or device may have a different size and a different number of I/O slots 22. Correspondingly, each package 12 has a different size and therefore a different "footprint," or amount of space it will take up on a printed circuit board. Package 12 connects to die 14 through array 24 of either bumps (for flip-chip packaging) or wires (for wirebond packaging). Through array 24, I/O slots 22 connect to package balls 26, which connect to the pins (not shown) exiting most ICs. Not all package balls 26 are useable, so I/O slots 22 connect only to useable package balls 26.

A desirable feature in IC design is scalability. Different packages 12 have different sizes, with a different number of useable package balls 26 for each size, able to support die 14 with a different number of I/O slots 22. Scalability in IC design means that different packages may integrate the same die, or different dies may be integrated into the same package. One impediment to this scalability is the I/O interface between die 14 and package 12 (or the PCB). One solution is to redesign hardmacs 18 for each die/package combination. However, this is expensive due to the time involved in designing hardmacs 18.

FIG. 2 is a block diagram illustrating a second solution with IC 30 made up of package 32 and die 34. In this example, die 34 is the same device as die 14 but integrated into smaller package 32, hence implementing scalability. Rcell fabric 36 supports hardmacs 38 with attachment points 42. Hardmacs 38 may be hardmacs 18 designed for the die/package interface of FIG. 1. Hardmacs 38 connect to some of bit slices 40, however, unused bit slices 41 are not connected to hardmacs 38. Hardmacs 38 may connect to bit slices 40 in groups of 8, 15, or 24, for example, depending of the particular design of hardmac 38. Bit slices 40 that are connected to hardmac 38 then connect to I/O slots 42. Unused I/O slots 43 are not connected to bit slices 40. Finally, I/O slots 42 that are connected to hardmacs 38 through bit slices 40 are connected to the useable portion of package balls 46 through array 44. Fewer I/O slots 42 and bit slices 40 may be used because there are fewer package balls 46 in package 32. Package 32 is smaller than package 12, for which die 34 and hardmacs 38 were designed.

One problem with this solution is that smaller packages may not be able to handle the congestion of I/O slots 42 required by hardmac 38, or IC 30 may be difficult to manufacture as result of I/O slot congestion in a smaller package. Another problem with this solution is a potential impact on line speed signal integrity. Also, in wirebonding, the gaps between used I/O slots (e.g. unused I/O slots) may be susceptible to uneven flow of the package material during assembly, resulting in a phenomenon known as "wire sweep" where used I/O slots short with each other.

Accordingly, what is needed is a system and method for providing scalability in an integrated circuit in a cost effective manner and avoiding the above-stated problems. The present invention addresses such a need.

BRIEF SUMMARY OF THE INVENTION

Aspects of the present invention include a system and method for providing scalability in an integrated circuit (IC) having a package coupled to a die through package balls. The die includes a plurality of input/output (I/O) slots and a hardmac configured to implement a logic function. A patch board is included between the hardmac and the I/O slots, wherein the hardmac includes a plurality of attachment points. The hardmac is attached to the plurality of I/O slots through the patch board, wherein adjacent attachment points join to non-adjacent I/O slots through the patch board.

According to the method and system disclosed herein, the present invention addresses the need of providing scalability with a patch board that connects I/O slots on a die to a hardmac designed for a different sized die. The I/O slots may be spread out (non-adjacent), thereby avoiding the problem of congestion, manufacturing difficulties, and wire sweep. Line speed integrity can be maintained by controlling the wire lengths in the patch board. This solution is cost-effective because hardmacs designed for the I/O interface of one die/package combination may be used in multiple packages, as well as between different types of packages (for example, wirebonding and flip-chip), saving on design costs.

DETAILED DESCRIPTION OF THE INVENTION

The present invention relates to integrated circuit design, and more particularly to a system and method for providing scalability in an integrated circuit. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Figure 3:
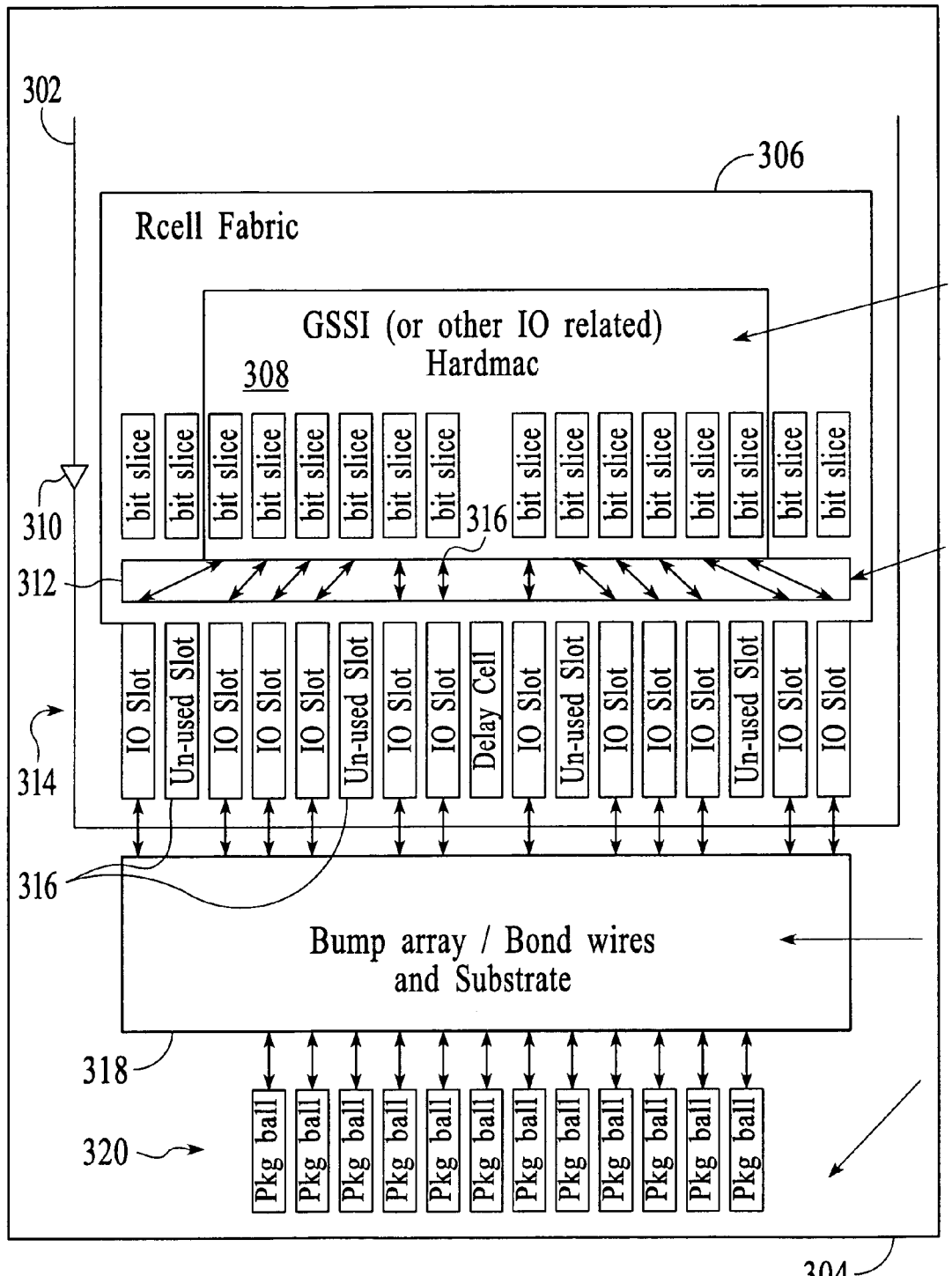
FIG. 3 is a block diagram illustrating one embodiment of the invention with a hardmac connected to I/O slots through a patch board.

FIG. 3 is a block diagram illustrating one embodiment of the invention in integrated circuit (IC) 300 having die 302 mounted in package 304. IC 300 may be, for example, an application-specific integrated circuit (ASIC) or a field-programmable gate array (FPGA). IC 300 may also include memory interfaces, for example double data rate (DDR) or quadruple data rate (QDR), SPI4 or LSI's RAPIDCHIP ASIC.

Die 302 includes rcell fabric 306 including the input/output (I/O) interface with hardmac 308. Hardmac 308 may be configured for source synchronous interfaces, for DRAM controlling, or other I/O related tasks. In this embodiment, bit slices 310 are built in to hardmac 308.

Figure 1:
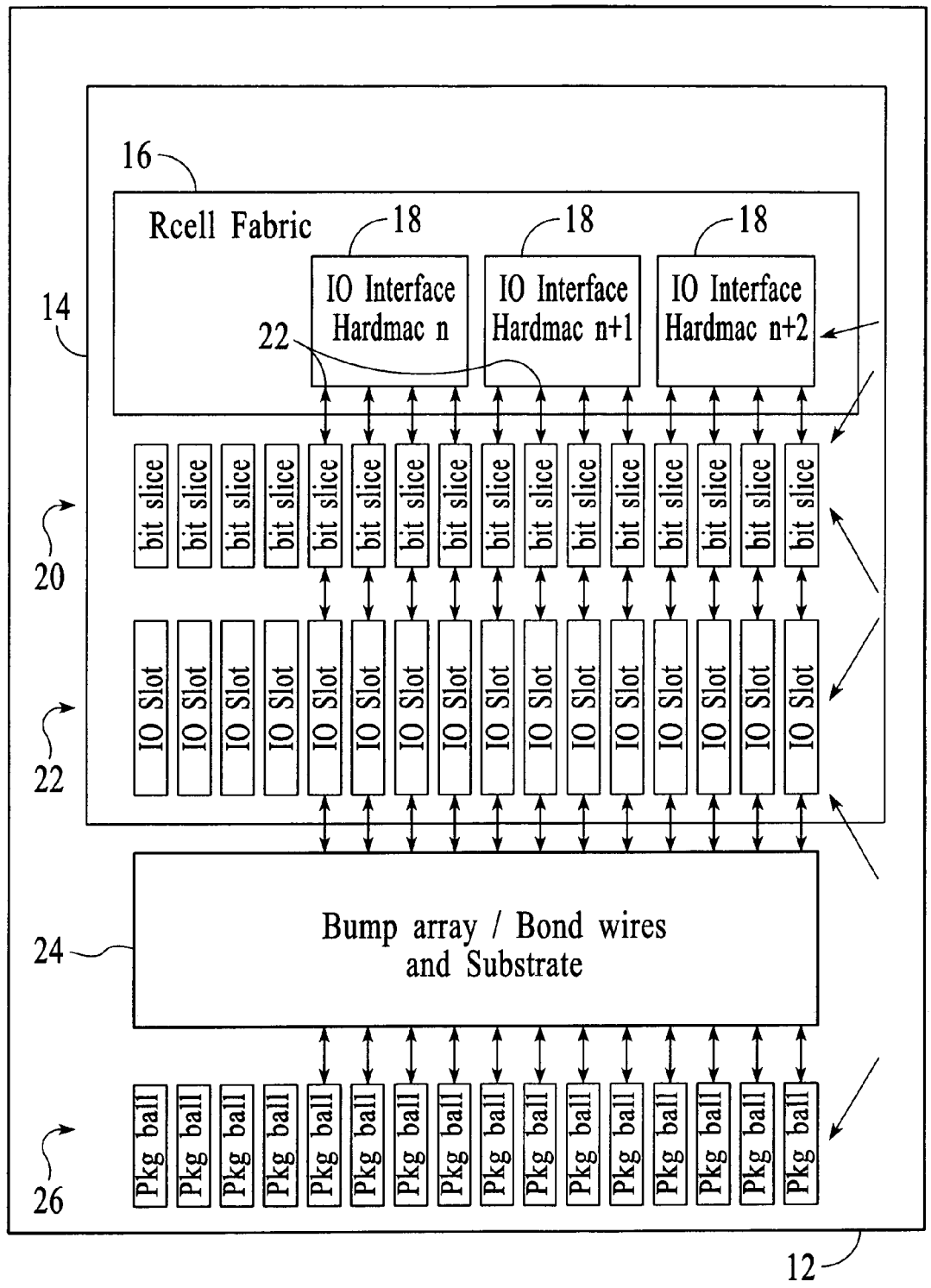
FIG. 1 is a block diagram illustrating an integrated circuit (IC) made up of a package and die combination.
Figure 2:
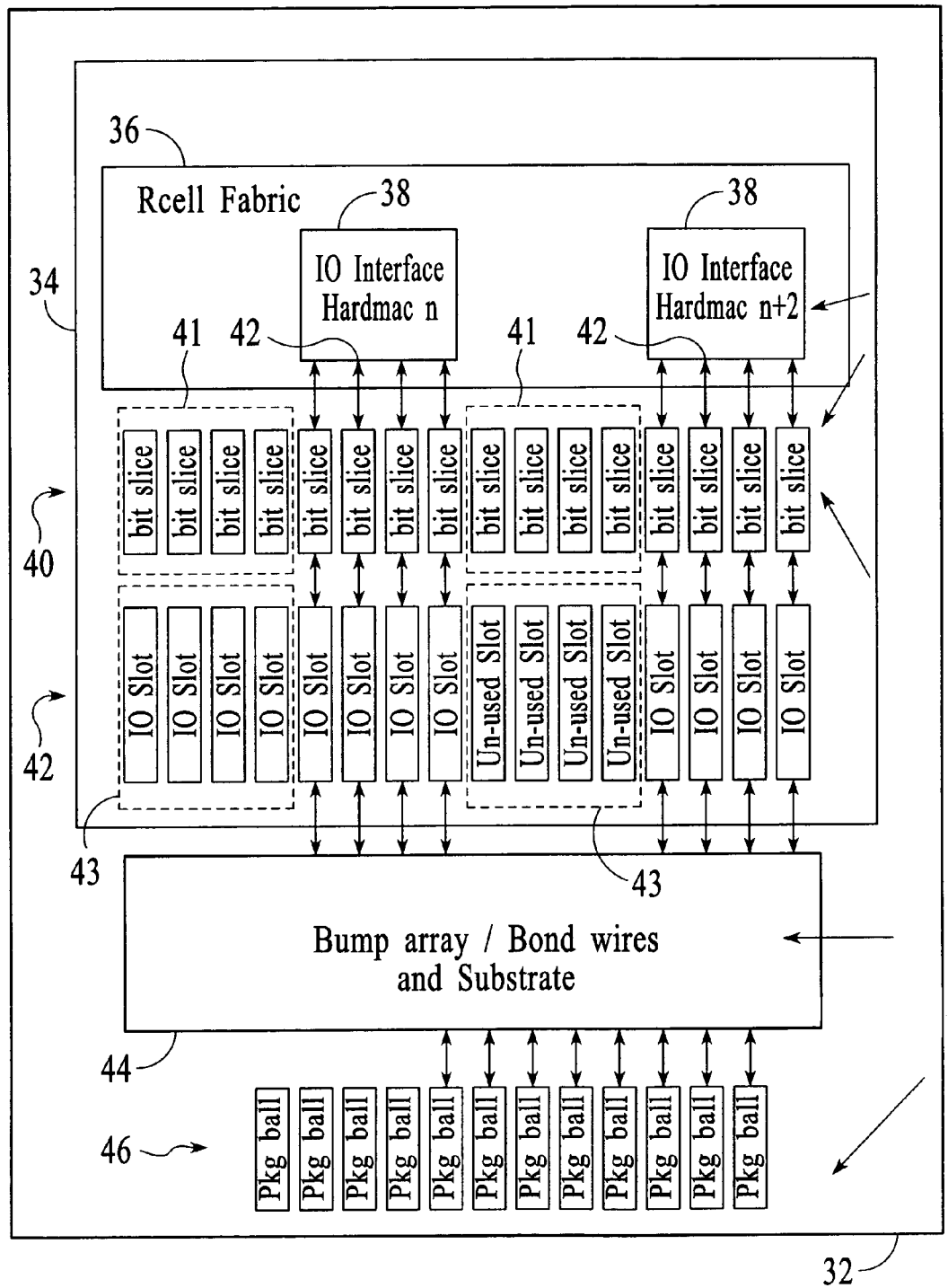
FIG. 2 is a block diagram illustrating an IC made up of a package and die combination.

In IC 300, in order to achieve cost-effective scalability, hardmac 308 was designed for a particular die/package combination. According to one method, the largest die/package combination (for a given ASIC, FPGA, etc.) is designed first with hardmac 308 providing a part of the I/O interface. In order to achieve cost-effective scalability, hardmac 308 is applied in multiple die/package combinations in order to avoid the expense of redesigning the entire interface with each combination. For each package that is smaller than the package in the initial die/package design, a direct connection between hardmac 308 and I/O slots 314 results in the problems outlined with respect to FIG. 2.

According to the present invention, patch board 312 is provided between hardmac 308 and I/O slots 314 as an interface of metal wires (not shown), for example. Patch board 312 does not abut directly to I/O slots 314, rather patch board 312 matches adjacent attachment points 316 on hardmac 308 to some adjacent I/O slots 314 and some non-adjacent I/O slots 314. Unused I/O slots 316 provide spacing in order to ease manufacturing, ease congestion and avoid wire sweep. Unused I/O slots 316 are insulated from patch board 312 in a conventional manner. The metal wires comprising patch board 312 may have shield traces for ground reference voltage pins or grounded traces around a critical path. Patch board 312 may provide equal signal routing lengths for each of the wires in order to maintain line speed integrity. Patch board 312 may reduce crosstalk between clock and voltage lines.

Patch board 312 is inexpensive to design relative to hardmac 308 for each die/package combination. Patch board 312 may be implemented in flip-chip or wirebonded packages, and eases transition between the two, which has typically posed problems in conventional system.

I/O slots 314 that are connected to hardmac 308 through patch board 312 are coupled to array 318 and to package balls 320. Array 318 may be bumps for a flip-chip package or wires for a wirebonded package. Array 318 may be insulated from unused I/O slots 316 in a conventional manner. Not all package balls 320 in package 304 may be useable.

Circuits into which the invention may be implemented include memory interfaces and links between ICs and/or backplanes (e.g. SPI4 type interfaces), for example. One example of die/package combinations begins with a package with 832 useable package balls may be matched to a die. Hardmacs for the I/O interface may be designed for 832 useable package balls. Then, a package with 640 useable package balls may implement a die with the same hardmacs as in the previous design, using patch boards to connect the hardmacs to the I/O slots. Then, a package with 480 useable package balls may implement the same hardmacs as in the first design, also using patch boards (different than in the last example) to connect the hardmacs to the I/O slots. This allows a die with 3 package options to be provided.

Alternatively, hardmacs for the I/O interface between a particular die/package combination may be designed, and the die substituted for different dies. Because the new die may not map exactly to the current package, patch boards may provide the interface between the new die and the package, saving cost in hardmac design for the new die/package combination.

Figure 4:
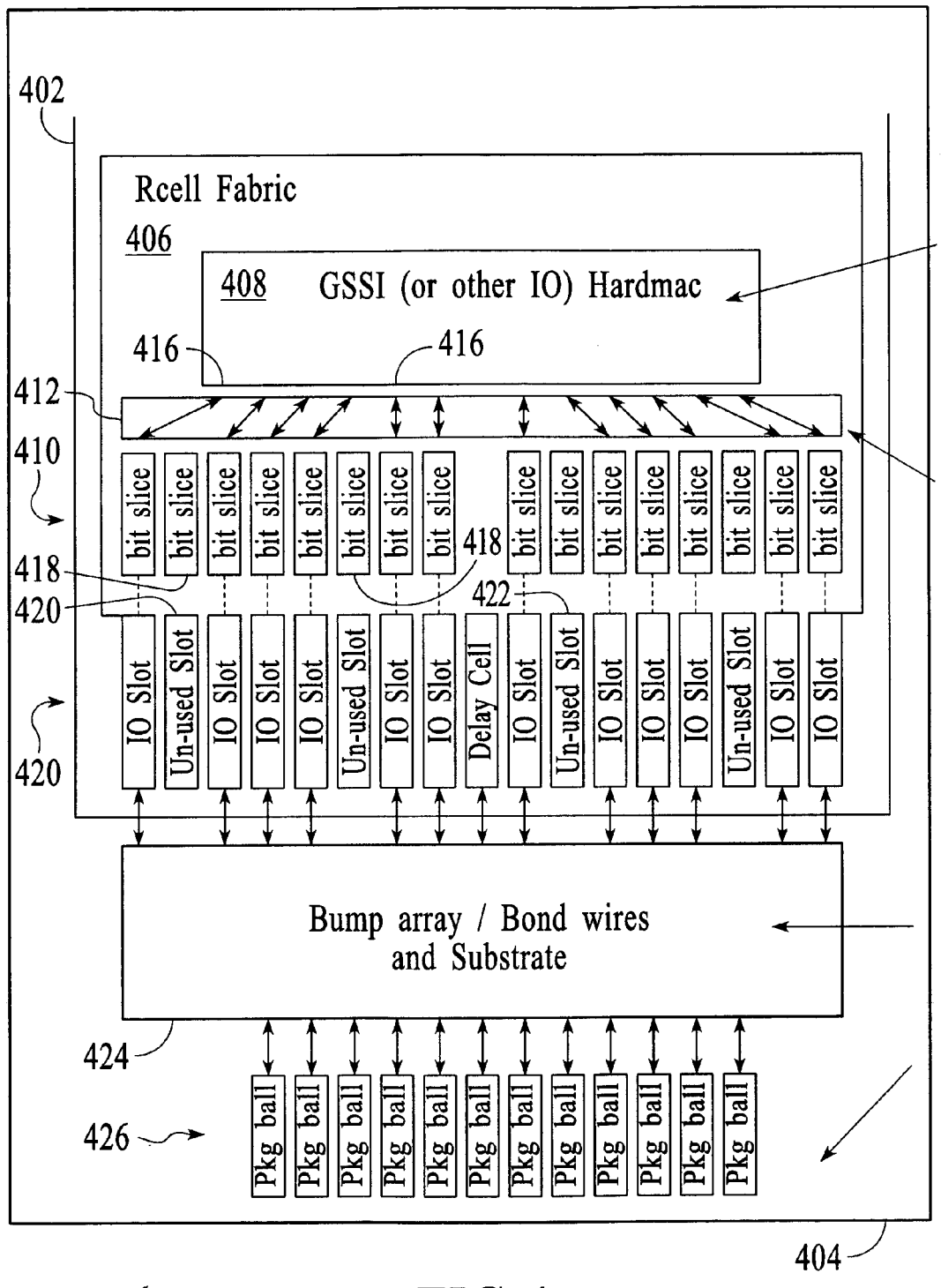
FIG. 4 is a block diagram illustrating one embodiment of the invention with a hardmac connected to I/O slots through a patch board.

FIG. 4 is a block diagram illustrating another embodiment of the invention in integrated circuit (IC) 400 having die 402 mounted in package 404. Die 402 includes rcell fabric 406 including the input/output (I/O) interface with hardmac 408. Hardmac 408 may be configured for source synchronous interfaces or other I/O related tasks. In this embodiment, bit slices 410 are built in to hardmac rcell fabric 406, though not into hardmac 408. Bit slices 410 may be integrated with or apart from rcell fabric 406, as well as built in to hardmac 408, or separate from hardmac 408.

Patch board 412 is a metal wiring hardmacro that is designed to provide an interface between hardmac 408 and I/O bit slices 410. Patch board 412 may provide equal signal routing lengths for each of the wires in order to maintain line speed integrity. Patch board 412 does not abut directly to bit slices 410, rather patch board 412 matches adjacent attachment points 416 on hardmac 408 to some adjacent bit slices 410 and some non-adjacent bit slices 410. Unused bit slices 418 provide spacing in order to ease manufacturing, ease congestion and avoid wire sweep in I/O slots 420. Unused bit slices 418 may be insulated from patch board 412 in a conventional manner.

Bit slices 410 that are connected to hardmac 408 through patch board 412 are coupled to I/O slots 420. Unused bit slices 418 will correspond to unused I/O slots 422. Through array 424, I/O slots 420 connected to hardmac 408 are connected to useable package balls 426. Array 424 may be bumps for a flip-chip package or wires for a wirebonded package. Array 424 may be insulated from unused I/O slots 422 in a conventional manner. Not all package balls 426 in package 404 may be useable.

A method and system for providing scalability in an integrated circuit has been disclosed. The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

We claim:

1. A system for providing scalability in an integrated circuit (IC) having a package with package balls, the system comprising:
   a die coupled to the package through the package balls, the die including:
   a hardmac configured to implement a logic function and having a plurality of attachment points;
   a plurality of input/output (I/O) slots;
   a patch board coupled to the hardmac and to the I/O slots and configured to connect adjacent attachment points to non-adjacent I/O slots.

2. The system of claim 1, the patch board further comprising:
   a plurality of metal wires.

3. The system of claim 2 wherein at least one of the plurality of metal wires includes electrical shielding.

4. The system of claim 1 wherein the package balls are coupled to the plurality of I/O slots that are connected to the hardmac.

5. The system of claim 1 wherein the package balls are insulated from the plurality of I/O slots that are not connected to the hardmac.

6. The system of claim 1, the die further comprising: a plurality of bit slices wherein the hardmac is coupled to the plurality of bit slices through the patch board, wherein adjacent attachment points connect to non-adjacent bit slices trough the patch board.

7. The system of claim 6, the patch board further comprising a plurality of metal wires.

8. The system of claim 7 wherein at least one of the plurality of metal wires includes electrical shielding.

9. The system of claim 6 wherein the I/O slots are coupled to the plurality of bit slices fiat are connected to the hardmac.

10. The system of claim 9 wherein the package balls are coupled to the plurality of I/O slots that are connected to the hardmac.

11. The system of claim 6 wherein the I/O slots are insulated from the plurality of bit slices that are not connected to the hardmac.

12. The system of claim 11 wherein the package balls are insulated from the plurality of I/O slots that are not connected to the hardmac.

13. The system of claim 1, wherein a second patch board is disposed between the hardmac and I/O slots so that an I/O interface of one die/package combination is adapted for use in multiple packages, and adapted for use between different types of packages.

* * * * *